June 4, 1940. R. W. GEORGE Re. 21,473

RECEIVING MEANS

Original Filed April 27, 1933 6 Sheets-Sheet 1

INVENTOR
RALPH W. GEORGE
BY H. S. Grover
ATTORNEY

June 4, 1940. R. W. GEORGE Re. 21,473

RECEIVING MEANS

Original Filed April 27, 1933 6 Sheets-Sheet 2

INVENTOR
RALPH W. GEORGE
BY H. S. Grover
ATTORNEY

June 4, 1940. R. W. GEORGE Re. 21,473

RECEIVING MEANS

Original Filed April 27, 1933 6 Sheets-Sheet 3

INVENTOR
RALPH W. GEORGE
BY H. S. Grover
ATTORNEY

RECEIVING MEANS

Original Filed April 27, 1933 6 Sheets-Sheet 4

INVENTOR
RALPH W. GEORGE
BY H. S. Grover
ATTORNEY

June 4, 1940.

R. W. GEORGE

Re. 21,473

RECEIVING MEANS

Original Filed April 27, 1933 6 Sheets-Sheet 5

INVENTOR
RALPH W. GEORGE
BY W. S. Grover
ATTORNEY

June 4, 1940. R. W. GEORGE Re. 21,473

RECEIVING MEANS

Original Filed April 27, 1933 6 Sheets-Sheet 6

INVENTOR
RALPH W. GEORGE
BY H. S. Grover
ATTORNEY

Reissued June 4, 1940 Re. 21,473

UNITED STATES PATENT OFFICE 21,473

RECEIVING MEANS

Ralph W. George, Riverhead, N. Y., assignor to Radio Corporation of America, a corporation of Delaware Original No. 2,035,745, dated March 31, 1936, Serial No. 668,232, April 27, 1933. Application for reissue February 3, 1940, Serial No. 317,220

37 Claims. (Cl. 250—20)

Figure 1:
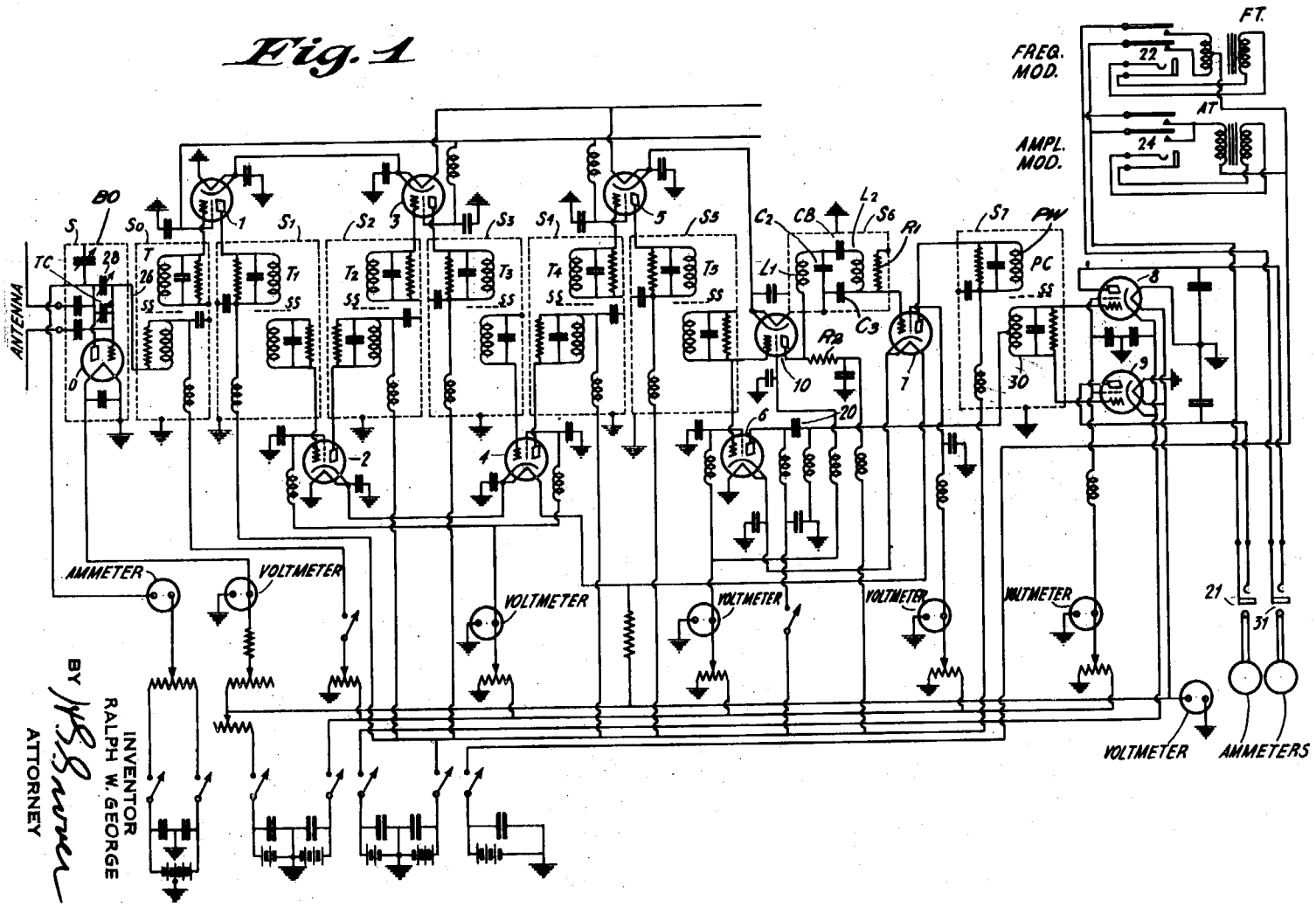

This invention relates to a receiver particularly adapted to relay and/or amplify and/or demodulate signal modulated carriers of the order of 70 centimeters in wave length or 428 megacycles in frequency. The invention is general, however, and is in no way limited to this definite value of wave length. My receiver demodulates carriers modulated in any of their characteristics, as for example, frequency or amplitude, or both simultaneously. For example, to obtain secret signalling I may key a tone (in code) giving frequency modulation at the transmiter for dots, and key another tone at the transmitter giving amplitude modulation for dashes. The receiver is of the superheterodyne type. The demodulator may utilize a standard first detector and oscillator or may use a self-oscillating first detector of 70 centimeter waves. Preferably the self-oscillating detector is of the Barkhausen type giving an output intermediate frequency of, say, 5.0 megacycles plus and minus the modulation frequency. The intermediate frequency amplifier is designed to amplify the band of frequencies between 4.7 and 5.3 megacycles, the total band being approximately 600 kilocycles wide. When frequency modulation is to be demodulated the system is broadly of the artificial line type similar to that disclosed in United States application Serial No. 618,154, filed June 20, 1932, in which amplitude modulation is eliminated from the output. Provision is made whereby the system may also receive amplitude modulated waves.

The present system includes numerous novel features. The present receiver includes a novel and more effective method of coupling the intermediate frequency output of the Barkhausen detector to the intermediate frequency amplifier. This is accomplished according to my invention by using the by-pass condenser in the Barkhausen oscillator circuit as the coupling impedance between the said oscillating detector and the primary of the first intermediate frequency transformer. The by-pass condenser is of such a value that it tunes the primary circuit of the intermediate frequency transformer to the intermediate frequency.

Another feature of the present invention is in the intermediate frequency transformers which are arranged to pass a frequency band 600 kilocycles wide, permitting the use of greater frequency modulation which is desirable, especially in the event there is present 10 or 20 kilocycles of spurious modulation. This intermediate frequency amplifier passes a band of sufficient width to make its use in television desirable. The intermediate frequency amplifier is coupled by one path which includes phase shifting means and phase reversal means to the grids of a pair of detector tubes in phase opposition, and over another path by way of a coupling tube cophasally to the electrical center of the input circuit.

In a modification increased efficiency is obtained by coupling the cophasal signal to the cathodes of the two detector tubes by way of a capacitive coupling instead of to the center tap of the input circuit.

The latter novel feature is further modified by directly coupling the anode of a coupling tube cophasally to the cathodes of the pair of rectifiers.

An advantage gained by the use of my novel system in the reception of ultra high frequencies with frequency modulation is that the amplitude modulation caused by mechanical vibration of a high frequency oscillating detector is balanced out in the succeeding stages of the receiver.

Furthermore, practice has taught me that the tube hiss originating in the first detector, whether of the self-oscillating Barkhausen type, as shown, or of the non-oscillating Barkhausen type using a separate heterodyne oscillator, is largely of amplitude modulation and thus is balanced out to an appreciable extent. It is also known that hiss originating in tubes at lower frequencies is likewise composed of appreciable amplitude modulation, however in the described receiver, by far the largest value of tube hiss comes from the first detector.

The novel features of my invention have been set forth in the claims appended hereto, as required by law.

Figure 1A:
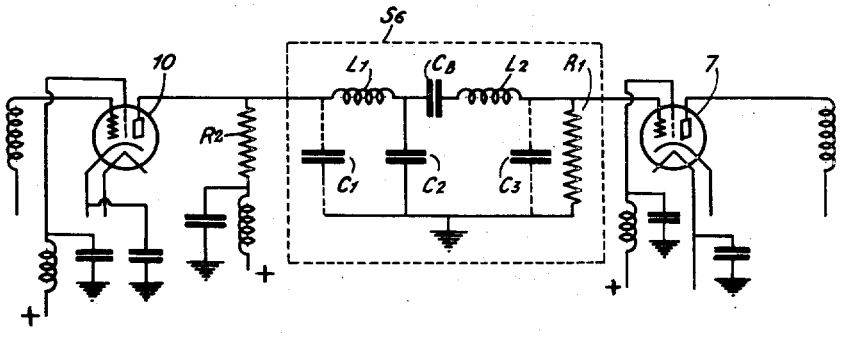
Figure 1B:
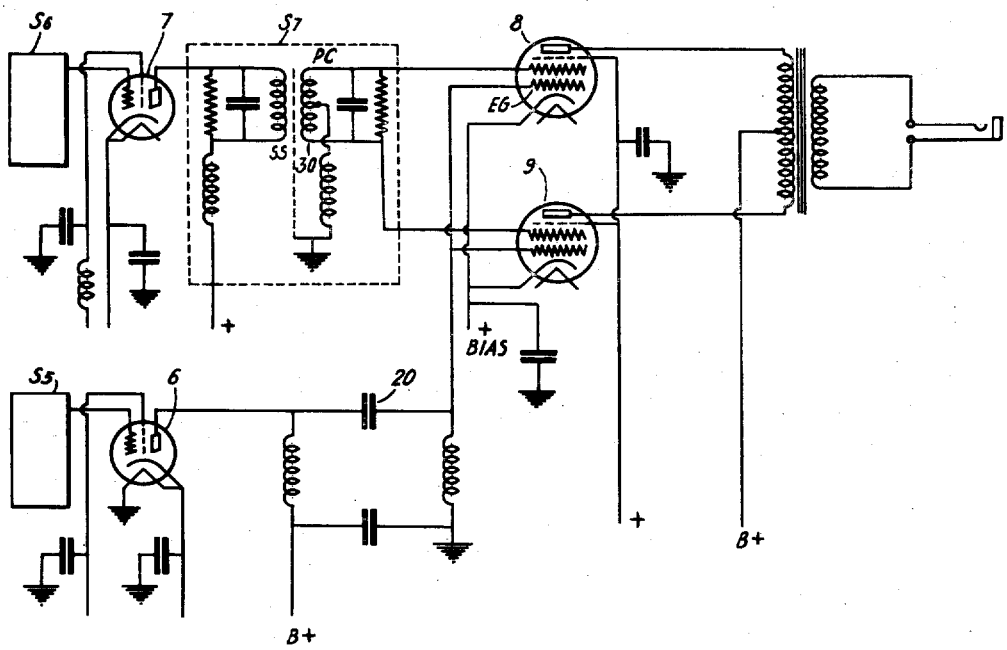
Figure 2:
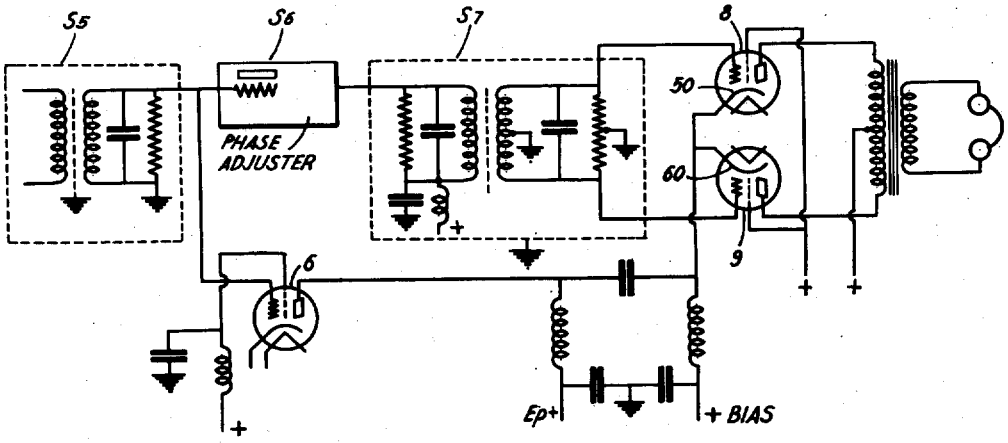
Figure 3:
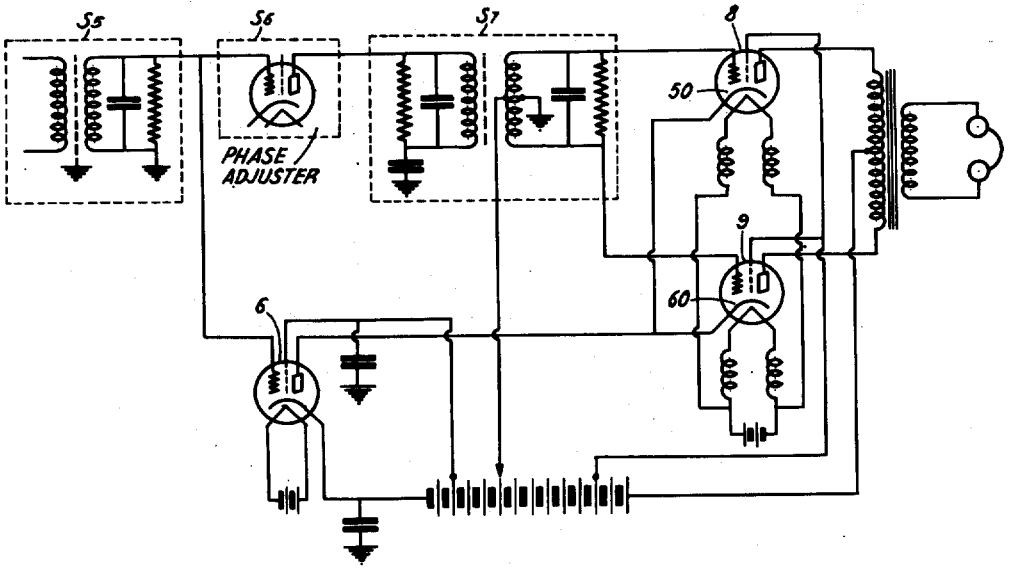
Figure 7:
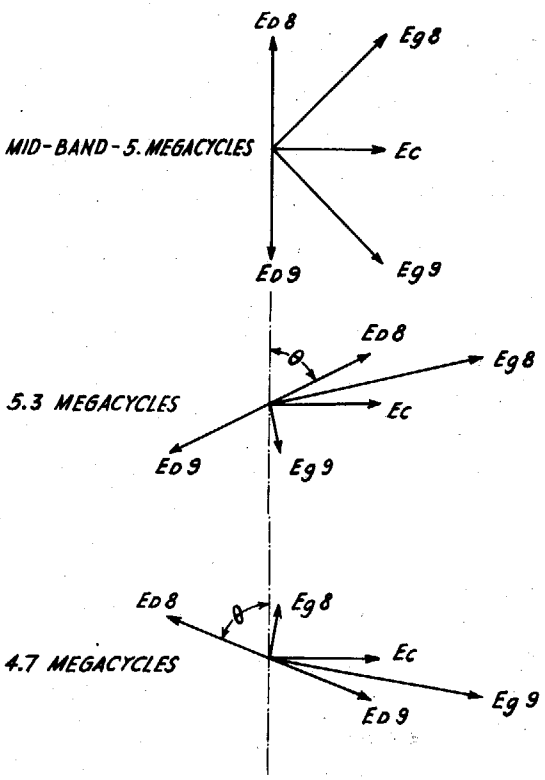
Figure 8:
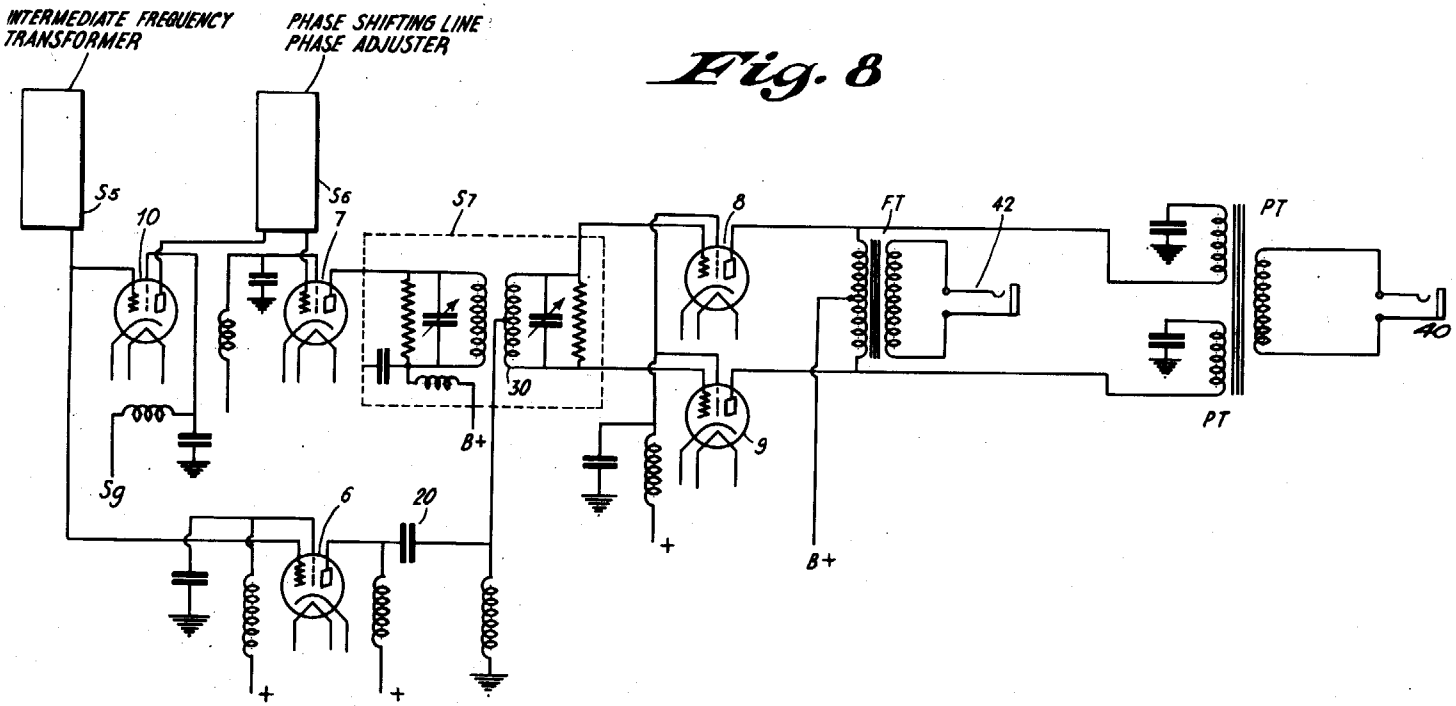

The nature of my invention and the mode of operation of the same will be best understood by the following description and therefrom when read in connection with the attached drawings, in which:

Figure 1 is a circuit diagram of a receiving system of the beat note type by means of which ultra short waves modulated in frequency or in amplitude may be received, amplified and demodulated;

Figure 1*a* shows a detail of the circuit of Figure 1;

Figures 1*b*, 2 and 3 show modifications of certain portions of the system of Figure 1;

Figures 4, 5, 6 and 7 are curves and vector diagrams which help to illustrate the operation of the system; while, Figure 8 shows a modification of a portion of the circuit of Figure 1.

The Barkhausen self-oscillator first detector stage BO which produces the intermediate frequency has been described in detail in my application Serial No. 587,109, filed January 16, 1932, Patent #2,011,942, August 20, 1935. This oscillating detector comprises a tube 8 having its control grid and anode connected by way of blocking condensers to an antenna system as shown. The tube 8 is of the Barkhausen type and when the grid and plate are coupled by tuning capacity TC, as shown, acts as a self-oscillating detector operating at a frequency determined in part by the capacity TC, when the anode and grid are energized by sources of direct current as shown.

The intermediate frequency amplifier is composed of six intermediate stages IF including six transformers T to $T_5$ inclusive, each enclosed in a separate shield S to $S_5$ inclusive and connected in cascade by the tubes 1, 2, 3, 4, and 5. Each transformer is enclosed in a shield, as shown, and energizing leads include the necessary filtering chokes and by-passing condensers to shunt radio frequency currents around the sources for the plates, screen grids, and cathode leads.

Figure 5:
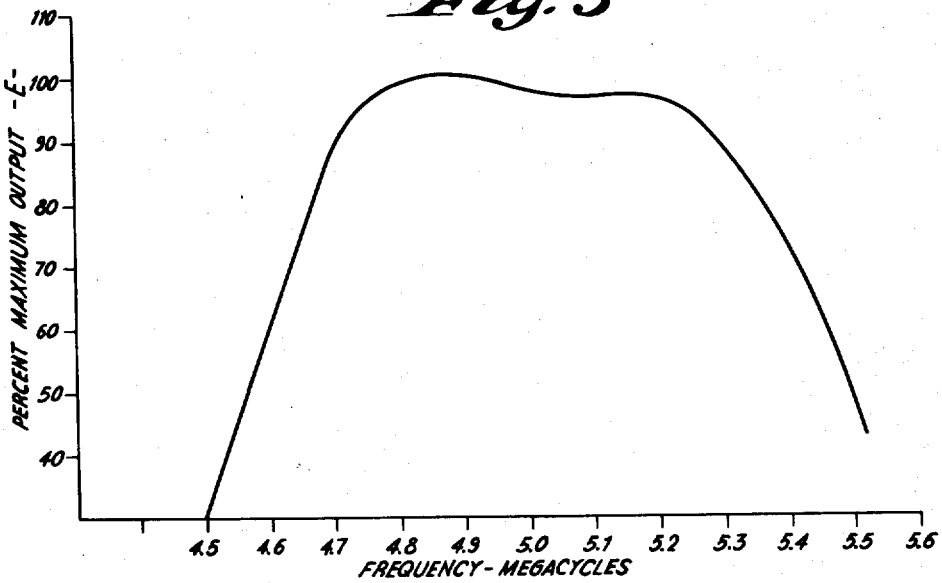
Figure 4:
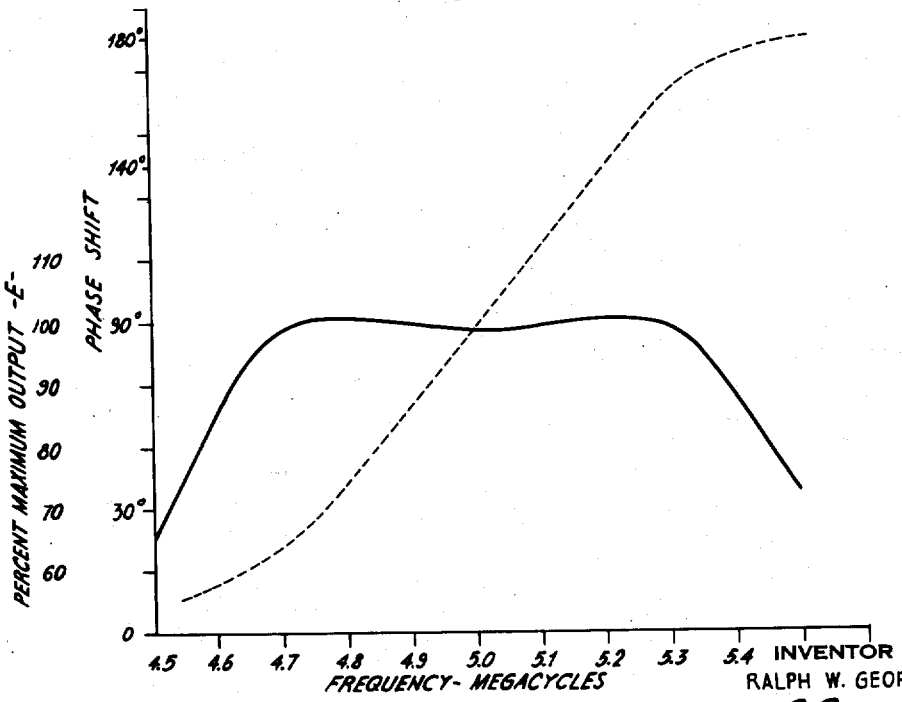

The secondary winding of the final intermediate frequency transformer $T_5$ is connected, as shown, to the control grid of a tube 6 and also to the control grid of a coupling tube 10. The anode of the tube 6 is coupled by a capacity 20, as shown, to the electrical center of the inductance 30 connected between the control grids of the tubes 8 and 9 in a balanced demodulator stage. The anode of the tube 10 is coupled by way of a phase shifting line $L_1$, $C_2$, CB, $L_2$ enclosed in shield $S_6$ to the control grid of a tube 7. The anode of tube 7 is coupled by the primary winding PW of a phase changing transformer PC in shield $S_7$ to the inductance 30 which may be considered the secondary of this transformer. The primary winding of each transformer described hereinbefore is separated by an electrostatic shield SS from the secondary winding. All intermediate frequency transformers including the phase changing transformer PC are identical in constants and tuning adjustment. Both the primary and secondary windings have fairly high inductance, say, 35 microhenrys each, to give as high an impedance as practical and thus increase the gain. The windings and tuning condensers are damped sufficiently with the resistance across them to flatten the double hump frequency response characteristic obtained by closely coupling the primary and secondary, as shown in Figure 4. In Figure 5 I have shown the overall frequency response of the intermediate frequency amplifier stages and the phase changing transformer including the artificial line in shield $S_6$.

The phase shifting line or artificial line in shield $S_6$ may include the essential elements as shown in Figure 1 or the elements as shown in detail in Figure 1*a*.

The phase shifting line is of conventional low pass filter design to give the desired phase shift of 90° at the grids of the detector tubes 8 and 9 with respect to the cophasal voltage applied through tube 6. The phase shifting line consists essentially of the elements $C_1$, $L_1$, $C_2$, $L_2$, $C_3$ and the characteristic impedance $R_1$. The condenser CB is an added blocking condenser and the resistances $R_1$ and $R_2$ are respectively used to supply grid current to the tube and plate current to tube 10. In order to obtain maximum impedance, $C_1$ is replaced by the capacity of the plate of tube 10 and the stray capacities of the leads to ground as shown in Fig. 1. Likewise, $C_3$ is replaced by the capacity of the grid of tube 7 to ground and a small condenser in parallel as shown in Figure 1. $C_1$ and $C_3$ are shown in dotted lines to indicate this. In operation, the phase shifting line acts as a transmission line of fixed physical length, and is designed to have an electrical length of one-quarter wave at 5 megacycles, thus giving a corresponding time delay of wave propagation of 90 degrees from the plate of tube 10 to the grid of tube 7. It is well known that in this type of artificial line, phase shift is proportional to frequency; thus, when the 5 megacycle carrier varies plus and minus 5% as it is modulated, the phase shift in this line varies from 90 degrees by plus and minus 5% which amounts to plus and minus 4½ degrees. This phase shift with frequency is, in fact, an advantage in this case as it is cumulative with that occurring in the phase changing transformer, thus giving slightly better sensitivity of the frequency modulation detector. Since, in the phase changing transformer, the ideal condition of plus and minus 90 degrees phase change with modulation is not realized, the additional plus and minus 4½ degrees is of some value. In practice, of course, the above stated values are not necessarily used. The phase changing transformer is essentially one section of a band pass filter with a flat frequency response characteristic as shown in Figure 4. This characteristic is obtained by tuning the primary and secondary independently of each other to 5 megacycles, then closely coupling the two tuned circuits to give the necessary coupling coefficient of approximately 12% and the addition of the damping resistances which are approximately 30% higher in value than the characteristic impedance of the filter. The above procedure is common practice in dealing with such types of band pass filters. It is well known that in a band pass filter embodying a flat frequency response characteristic there occurs a phase shift proportional to frequency over the flat part of the characteristic; at the lower frequency the phase shift is zero; at the mid-band frequency it is 90 degrees; and at the higher frequency it is 180 degrees. I have drawn a broken curve in Figure 4, showing approximately the phase shift with frequency. It will be seen that the useful phase change is about plus and minus 70 degrees; hence, the additional cumulative phase shift occurring in the phase shifting line, previously mentioned, is advantageous in securing maximum sensitivity to frequency modulation. This fact can be readily seen from the vector diagrams in Figure 7.

As has been stated before, the IF transformers are identical in all details with the phase changing transformer, with the exception of the mid-tap on the secondary of the latter, and it follows that there will be a similar phase shift with frequency in each; however, it can be easily seen that this phase shift is of no consequence in the frequency demodulation system which begins with the cophasal output of the IF amplifier to tubes 6 and 10.

The incoming signal modulated oscillations set up oscillations in the oscillating detector BO and produce signal carrying oscillations of an intermediate frequency.

The band of signal carrying intermediate frequencies is passed through the intermediate frequency amplifier and fed cophasally to the grids of the tubes 6 and 10. Tube 6 feeds the grids of the detector tubes 8 and 9 cophasally at the center tap on the grid coil through the capacitively coupled circuit in the plate circuit of tube 6. The impedance of the plate of tube 6 to ground, and its associated radio frequency circuit, is, in accordance with the present invention, made to be as purely capacitive as possible, and still retain a reasonable impedance to effect a 90 degree phase shift from the grid voltage to the output voltage applied cophasally from the anode of 6 by way of capacity 20 to the electrical center of the inductance 30 connected to the detector grids. This capacitive impedance serves also to eliminate possible phase shift of the intermediate frequency due to frequency shift in this circuit. Tube 10 feeds an artificial line $L_1$, $L_2$, $C_3$ which gives relatively a 90 degree phase shift of the voltage of the oscillations at the anode of tube 7 as compared to the voltage of the oscillations on the grid of tube 10. The phase shifted oscillations in the output of tube 7 are fed into the phase changing transformer PC in shield $S_7$. The phase changing transformer produces approximately an additional 90 degree phase shift in the voltages of the oscillations, which phase shift is cumulative at the mid-band of the passed frequency. The result is that the band of signal carrying oscillations is fed differentially to the grids of the detector tubes 8 and 9 and to said grids 90 degrees out of phase with respect to a component of the signal which is fed cophasally to the grids of said tubes. The plates of the detectors 8 and 9 are connected in push-pull by transformer FT and jacks 22 for frequency modulation detection and in parallel by transformer AT and jacks 24 for amplitude detection. Signals resulting from demodulation of amplitude modulated signals will appear in a circuit connected with jack 24 while signals resulting from frequency modulation will appear in a circuit connected to jack 22.

Figure 6:
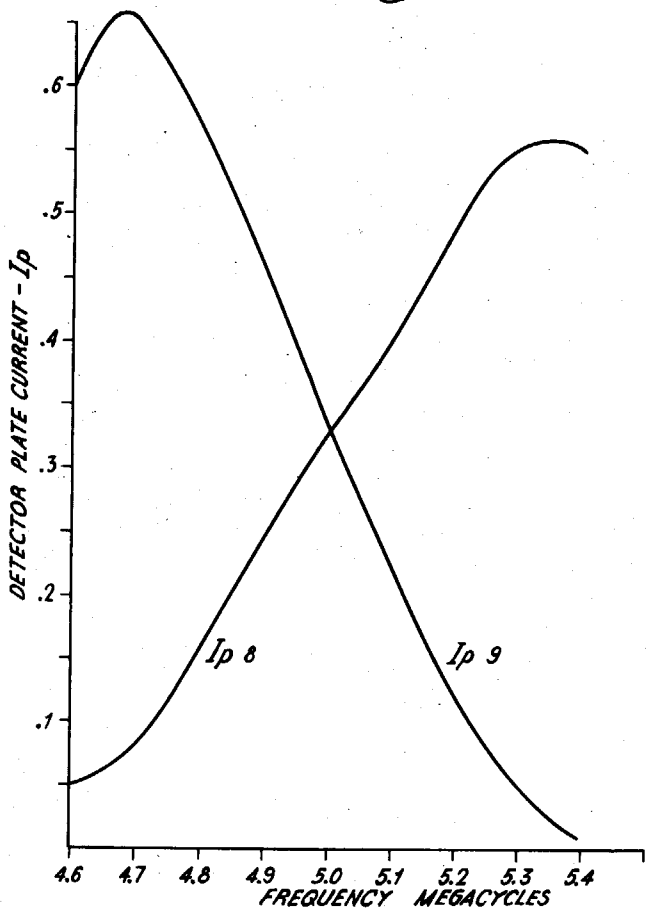

Jacks 21 and 31 are provided for the connection of plate current meters as shown. These meters are necessary in adjusting the receiver and are an aid in tuning. The following conditions can be obtained by their aid. The detector tubes 8 and 9 must be balanced and their bias properly adjusted for ordinary bias detection; the cophasal and antiphasal signals impressed on the grids of tubes 8 and 9 must be adjusted to be equal for maximum sensitivity to conform to Figure 7; and in tuning, the IF must be at the mid-band frequency which is indicated by equal plate currents as can be seen in Figure 6.

Actually, both demodulated amplitude and frequency types of modulation appear in each plate circuit.

More in detail, the operation of the device is as follows: Ultra high frequency signal carrying oscillations are converted by the oscillating detector 0 in stage BO to a high intermediate frequency. The intermediate frequency produced in 0 is taken from the control grid side of the Barkhausen circuit by a lead 26 and fed through the primary winding of the first intermediate transformer T. The total capacities connected between the grid and ground, including mainly the by-pass condenser 28 between the plate and grid of the Barkhausen circuit, are so adjusted as to tune the intermediate frequency transformer primary to resonance at the intermediate frequency. Thus, the by-pass condenser 28 serves two main purposes. It acts as a by-pass path in the Barkhausen oscillating detector circuit to shunt the high frequency oscillations in said circuit around the energy sources and serves also for tuning the intermediate frequency output circuit, giving mavimum coupling between the detector and the intermediate frequency amplifier at the intermediate frequency. Any slight variation in the capacity of the Barkhausen tuning condenser necessary to tune the Barkhausen oscillator has a negligible effect on the total capacity which tunes the intermediate frequency output circuit. The signal carrying intermediate frequency band is amplified in the intermediate frequency amplifier and fed cophasally to the coupling tubes 6 and 10. Since it is thought that the use of a definite frequency to illustrate the invention will make the same more clear, it is assumed that the intermediate frequency is 5 megacycles plus and minus 300 kilocycles. Applicant is not, however, limited to such frequencies since obviously others may be used. Tube 6 is coupled to the electrical center of the inductance 30 between the grids of the detector tubes 8 and 9, thus feeding the detector grids cophasally with signal voltages substantially 90 degrees out of phase with the signal voltages at the grids of tubes 6 and 10. Tube 10 feeds through the artificial line or other phase shifting circuit in $S_6$, coupling tube 7 and the phase changing transformer PC, the grid electrodes of the detectors 8 and 9 differentially phased signal, the voltage of which is substantially 180 degrees out of phase, and in phase, at the mid-band frequency, with respect to the voltage of the signal at the grid of tube 10. These voltages fed to the grids of tubes 8 and 10 therefore are plus and minus 90 degrees out of phase with respect to the voltage of the signal fed cophasally from 6 to the grids of 8 and 10 as shown by the vector in Figure 7. More in detail, if we consider the various voltages applied to the grids of tubes 8 and 9 vectorally we will have a resultant voltage $E_g8$ and $E_g9$ on the grids when ED9=the differentially phased component. $E_c$=the cophasal component, and $\theta$, the phase, is less than 90 degrees. Thus, at the mid-band frequency, the plate currents of the two detector tubes are equal. However, when the frequency increases to 5.3 megacycles (maximum), the inherent phase change with frequency change in the phase changing transformer gives a phase change of the differentially fed signal approaching 90 degrees as a satisfactory operating limit, in which case the phase of the differentially fed signal on the grid of tube 8 is almost in phase with the cophasally fed signal, as shown in the second diagram of Figure 7, and the phase of the differentially fed signal on the grid of tube 9 is almost 180 degrees out of phase with the cophasally fed signals. The conditions are reversed when the signal frequency approaches 4.7 megacycles, the lower frequency limit of the band. The resulting differential plate current characteristic is shown by the curve in Figure 6 and converts the frequency modulations into amplitude changes when utilized by the audio transformer connected in push-pull to the output electrodes of tubes 8 and 9. The operation of a balanced modulation detector of this type has been explained in United States application Serial No. 618,154, filed June 20, 1932. A brief statement of the manner in which the frequency modulations are converted into amplitude variations when taken with the vectors of Figure 7 and curve of Figure 6 should suffice here. The frequency modulated waves are applied cophasally and in phase opposition to the control grids of tubes 8 and 9. Assume the frequency is constant and at the center of the band of frequencies passed by the intermediate frequency amplifiers 1, 2, 3, 4, 5 and 6.

It can be shown vectorally, as illustrated in the first diagram of Figure 7 that these differentially and cophasally applied potentials will, when combined, produce a resultant voltage on the grids of tubes 8 and 9 which can be shown to be 90 degrees out of phase. These resultant voltages will produce a steady flow of current in the output circuits of each of tubes 8 and 9. Since the output circuits of tubes 8 and 9 are connected in push-pull for frequency modulation, the energies from the two tubes add and produce a resultant energy characteristic of the sum of the energies. Frequency modulation causes the plate currents of the two detector tubes to vary differentially and according to the frequency modulation; this variation is utilized by the push-pull transformer connection; amplitude modulation appears equally in both tubes and thereby is cancelled in the push-pull transformer connection.

Now assume that the frequency of the oscillations passed by the intermediate frequency amplifier increases due to frequency modulation. The voltages applied to the control grids of the tubes 8 and 9 by the cophasal connection and by the phase opposition coupling will be shifted, as indicated by the second vector diagram in Figure 7. The voltages applied in phase opposition will still be 180 degrees out of phase with respect to each other but will be shifted in the spectrum with respect to the voltages applied by the oscillations in phase opposition when the frequency of the waves was at the midpoint of the intermediate frequency amplifier, as illustrated in diagram No. 1 of Figure 7. This shifting of the frequency will, as shown vectorally in the second diagram of Figure 7, produce new resultants on the grids of tubes 8 and 9 respectively. These resultant voltages are of different amplitude and cause anode currents of different amplitude to flow in the output circuits, as illustrated in the diagram of Figure 6. The amplitude of the combined resultants in the output circuit, of course, changes.

In like manner it has been shown vectorally in Figure 7 and diagrammatically in Figure 6 that if the frequency of the waves passed by the intermediate frequency amplifier shifts to a value below the midpoint of the intermediate frequency amplifier, a shift of the vectors in an opposite direction will take place. This shift produces resultants of different voltage on the control grids of tubes 8 and 9 and therefore causes said tubes to pass different values of anode current. In the above manner the frequency modulation of the high frequency carrier is caused to produce amplitude variations in current characteristic of the signal modulations.

In Figure 1b I have shown a modified means for applying the cophasal signals from the tube 6 to the detector. As shown the amplified oscillations may be applied from the output of tube 6 to a separate element such as an extra control grid EG in each of the tubes instead of to the cathodes or to the control grids fed by the phase changing transformer. The advantage is obvious in view of the possible higher capacitive reactance of such separate grid elements.

If the oscillations at intermediate frequency are applied by way of the coupling tube 6 cophasally to the cathodes of the tubes 8 and 9 increased efficiency is obtained.

An additional circuit by means of which the oscillations may be applied cophasally to the cathodes is illustrated in Figure 2. In Figure 2 the elements shown may replace the intermediate frequency transformer enclosed in the shield $S_5$, the coupling tube 6, the artificial line enclosed in the shield $S_6$, the tube 10, the tube 7, and the phase shifting transformer PC and the detector tubes 8 and 9. In Figure 2 the anodes of the tubes have been shown as being coupled in push-pull relation for the reception of frequency modulated waves. Obviously, I contemplate a parallel connection of the anodes of these tubes to receive amplitude modulated waves.

In Figure 3 I have shown a modified form of the circuit of Figure 2. The circuit of Figure 3 may replace the same elements which the circuit of Figure 2 may replace, as set forth above.

Figures 2 and 3 show two circuit variations in the phase shifting transformer coupling tube 6 and balanced modulator detectors 8 and 9 which do not change the fundamental principles of operation but improve the coupling of the cophasally fed signal to the detector. The circuit of Figure 2 is the same as the corresponding portion of the circuit used in the embodiment described in connection with Figure 1 with the exception that the cophasal signal is fed to the cathodes 50 and 60 of the detectors 8 and 9 instead of to the center tap on the input inductance 30. This results in approximately 50 percent more cophasal voltage impressed on the detector, and simplifies the practical arrangement of the circuit as shown.

In Figure 3 I have shown a direct coupled arrangement for feeding the cophasal signal from the plate of the coupling tube 6 to the cathodes 50 and 60 of the detectors 8 and 9. The circuits of Figures 2 and 3 are otherwise similar to the corresponding parts of Figure 1 except that in the circuit of Figure 3 the filament heating leads include radio frequency chokes as shown, the purpose of which is to reduce the capacity between the tube elements and ground.

Apparent advantages are, simplification of the circuit, and maximum cophasal signal voltage on the cathodes 50 and 60 of the detectors 8 and 9. A further refinement of the circuit of Figure 3, which would apply to the circuit of Figure 1, is shown in the use of chokes in each side of the filament or heater leads. This greatly reduces the capacity between the cathode and ground and results in an increase in the capacitive impedance to ground of the cophasal coupling circuit which increases the cophasal signal voltage impressed on the cathodes.

It is also obvious that, in order to get the desired phase relation between the cophasal and differential phased signal at the detectors 8 and 9, any method of phase shifting or phase adjustment that is known and is suitable may be used. Such phase adjustment need not necessarily be made in the portion of the circuit in which the artificial line is placed, that is, in the unit enclosed in $S_6$, but it may be placed in any other part of the circuit to accomplish the desired phase adjustment, such as in the cophasal coupling circuit.

It is also conceived that the first detector is not limited to the Barkhausen type, but it may be similar to first detectors in superheterodyne circuits already in use.

It is further conceived that under some conditions the intermediate amplifier will not be needed and the first detector can be coupled directly to the second detector by way of the phase shifting circuits and coupling tubes as shown.

The manner in which the electrodes of the tubes used in the various circuits are energized will be obvious by inspection of the drawings and needs no detailed description here. It might be noted, however, that it is desirable to include in the screen grid energizing leads, in certain of the control grid energizing leads, and in certain of the anode energizing leads, choking inductances and radio frequency by-pass condensers to prevent ultra high frequency oscillations dealt with in the receiver and the high frequency oscillations dealt with in the intermediate frequency amplifier from reaching the energizing sources and reacting therein to produce unstable operation of the device. Each element of the receiver is, as shown, included in a separate grounded shield to electrically isolate the circuits of the several elements to prevent reaction therebetween. The transformer windings of the various intermediate frequency transformers and of the phase changing transformers are separated as shown by electrostatic shields SS, which may be of the type covered by United States application No. 598,731, filed November 3, 1922, matured into Patent #1,942,578, on January 9, 1934.

Where signals modulated in frequency by a keyed tone to produce one element of a signal and simultaneously modulated in amplitude by another keyed tone to produce another signal element for secrecy purposes, are transmitted, the receiver of Figure 1 may be modified in its circuits associated with the output electrodes of detectors 8 and 9 as indicated in Figure 8. Amplitude modulated signal elements could be separated out from the frequency modulated signal elements by the parallel transformers PT and appear in any indicating device plugged into jack 40. The elements represented by frequency modulated waves will be separated out in transformer FT and appear in an indicating device plugged into jack 42.

Having thus described my invention and the operation thereof, what I claim is:

1. Means for receiving signal modulated oscillations of ultra high frequency comprising, an oscillating detector having a frequency determining circuit connected between its control grid and anode, a capacity by-passing said frequency determining circuit, said by-passing capacity tuning said circuit to the beat frequency produced in said oscillating detector due to reaction between the signal wave and oscillations produced in said detector, an intermediate frequency amplifier coupled to said by-passing capacity, rectifying means, and a plurality of paths coupled between said intermediate frequency amplifier and said rectifying means, one of said paths including phase shifting means.

2. A circuit for receiving signal modulated oscillations of ultra high frequency comprising, an oscillating triode having control grid, anode and cathode, and a frequency determining circuit connected between its control grid and anode and to said cathode, means for impressing a signal wave on said triode, a capacity by-passing said frequency determining circuit, said by-passing capacity tuning said circuit to the beat frequency produced in said oscillating detector due to reaction between signal wave and oscillations produced in said detector, an intermediate frequency amplifier coupled to said by-passing capacity and tuned to the beat frequency, detecting means, and a plurality of paths coupled between said intermediate frequency amplifier and said detecting means, one of said paths including phase shifting means and phase reversing means.

3. A circuit for demodulating modulated waves of constant amplitude including, an oscillating detector comprising, a thermionic tube having its input and output electrodes coupled by a frequency determining circuit and to radiant energy absorbing means, an intermediate frequency amplifier, a capacitive coupling between said amplifier and said oscillating detector, a pair of thermionic tubes each having like input electrodes, a phase shifting circuit coupled to said intermediate frequency amplifier on the one hand and to like input electrodes of said thermionic tubes on the other hand, and a coupling tube having its input electrodes coupled to said intermediate frequency amplifier on the one hand and its output electrodes coupled to said like input electrodes in said pair of thermionic tubes on the other hand.

4. A circuit for demodulating ultra high frequency waves including an oscillating detector comprising, a thermionic tube having its input and output electrodes coupled by a frequency determining circuit and to radiant energy absorbing means, an intermediate frequency amplifier, a capacitive coupling between said amplifier and said oscillating detector, a pair of thermoinic tubes each having a control electrode and an output electrode, a phase shifting circuit coupled to said intermediate frequency amplifier on the one hand and to a control electrode in each of said thermionic tubes on the other hand, a coupling tube having its input electrodes coupled to said intermediate frequency on the one hand and its output electrodes coupled to a control electrode in each tube of said pair of thermionic tubes on the other hand, and circuits connecting the output electrodes of said tubes either in parallel or in push-pull.

5. The method of demodulating frequency modulated high frequency oscillatory energy which includes the steps of, reducing the frequency of said modulated oscillatory energy, amplifying said oscillatory energy of reduced frequency, dividing said amplified oscillatory energy into two portions each of which portions includes energy of the mean carrier frequency and side band frequencies, producing a phase shift in the oscillatory energy of one of said portions, said produced phase shift being 90° for the oscillatory energy of said portion of the mean frequency, producing a phase shift of the oscillatory energy in said other portion, the phase shift produced in said last portion being substantially a phase reversal of the oscillatory energy of said last named portion of the mean frequency, and differentially combining said last named oscillatory energy with the oscillatory energy in said one of said portions to produce a resultant.

6. The method of demodulating signal carrying ultra high frequency oscillatory energy which includes the steps of beating said oscillatory energy with other oscillations to reduce the frequency of said oscillatory energy, amplifying said oscillatory energy of said reduced frequency, dividing said amplified oscillatory energy into two portions, producing a phase shift in one of said portions, said produced phase shift being substantially 90° for the oscillatory energy of said portion of the mean frequency, producing a phase shift of the oscillatory energy in the other of said portions, the phase shift produced in said last portion being substantially a phase reversal of the oscillatory energy of said last portion of the mean frequency, differentially combining said last named phase reversed oscillatory energy portion with the phase shifted oscillatory energy in said first one of said portions, and demodulating the combined oscillatory energy.

7. Frequency modulated oscillation demodulating means comprising, a thermionic tube having an input circuit responsive to said oscillations and an output circuit, a pair of thermionic detectors having input electrodes, a phase shifting circuit coupling the output circuit of said first named tube in phase opposition to the input electrodes of said thermionic detectors, a second thermionic tube having an input circuit responsive to said oscillations, said second thermionic tube having an output circuit, and a circuit coupling the output circuit of said second named tube cophasally to the input electrodes of said detectors.

8. Signal demodulating means comprising, a source of signal modulated oscillations, a pair of thermionic detector tubes each having an input electrode and an anode, circuits connecting the anode electrodes of said tubes in push-pull relation, a thermionic coupling tube having an input electrode and an output electrode, said tube having its input electrode coupled to said source of oscillations, means for coupling the output electrode of said last named tube differentially to the input electrodes of said detector tubes including, a phase shifting circuit and a phase shifting transformer, an additional thermionic tube having input and output electrodes, said additional tube having its input electrodes coupled to said source of oscillations, and a circuit coupling the output electrodes of said additional tube cophasally to the input electrodes of said detector tubes.

9. In a signal demodulating means to be used with a source of signal modulated oscillations, a pair of thermionic detector tubes each having an anode, a cathode and a control grid, a circuit connecting the cathodes and anodes of said tubes in push-pull relation, a thermionic coupling tube having input electrodes and output electrodes, said tube having its input electrode coupled to said source of oscillations, means for coupling the output electrodes of said last named coupling tube differentially to the control grids of said detectors, said means including a phase shifting circuit and a phase shifting transformer, an additional thermionic coupling tube having input electrodes and output electrodes, a circuit coupling the input electrodes of said additional tube of said source of oscillations, and a circuit coupling the output electrodes of said additional tube cophasally to the cathodes of said detector tubes.

10. An arrangement as recited in claim 9 in which the output electrodes of said additional tube are directly coupled to the cathodes of said detector tubes.

11. Signal demodulating means to be used with a source of oscillations simultaneously varied at signal frequency in amplitude and in frequency comprising, a pair of thermionic tubes, each having a control grid, a cathode and an anode, an input circuit including an inductance connected between said control grids, means for applying said oscillations cophasally and in phase opposition to said inductance, a transformer having a primary winding connecting the anodes of said tubes in push-pull relation, said transformer also having a secondary winding, means for the connection of an indicator with the secondary winding of said transformer, a second transformer having a pair of primary windings and a secondary winding, circuits connecting said primary windings in parallel with the anode-to-cathode impedances of said tubes, and means for the connection of an indicator with the secondary winding of said last named transformer.

12. Signal demodulating means comprising, a source of signal modulated oscillations of constant amplitude, a pair of thermionic tubes each having an anode and a cathode and a plurality of control grid electrodes, a reactance having one terminal connected to a control grid in one of said tubes and the other terminal connected to a control grid in the other of said tubes, a circuit connecting a point on said reactance to the cathodes of said tubes, a circuit connected to said source and coupled to said reactance for applying signal modulated oscillations in phase opposition from said source to said control grids by way of said reactance, a circuit connecting another control grid in each tube together and to the tube cathodes by way of a common impedance, and a circuit connecting said source of signal modulated oscillations to said impedance for applying signal modulated oscillations cophasally to said other control grids in said tubes.

13. Frequency modulated oscillation demodulating means comprising, a thermionic tube having an input circuit responsive to said oscillations, said tube also having an output circuit, a pair of thermionic detectors each having an input electrode, a phase shifting network comprising series inductances separated by a series capacity connected in the output circuit of said first named tube, means for coupling said phase shifting network in phase opposition to the input electrodes of said thermionic detectors, a second thermionic tube having an input circuit responsive to said frequency modulated oscillations, said second tube also having an output circuit, and a circuit coupled to the output circuit of said last named tube and to the input electrodes of said detector for applying said oscillations from the output circuit of said last named tube cophasally to the input electrodes of said detectors.

14. A circuit for demodulating ultra high frequency waves modulated in amplitude and in frequency including, radiant energy absorbing means, an oscillating detector comprising, a thermionic tube having input and output electrodes, a frequency determining circuit coupling said electrodes together and to said radiant energy absorbing means, an intermediate frequency amplifier, capacitive means coupling said intermediate frequency amplifier to said oscillating detector, a pair of thermionic detector tubes having input electrodes and output electrodes, a phase shifting circuit coupled between said intermediate frequency amplifier and the input electrodes of said thermionic detectors, said phase shifting circuit including inductances in series separated by a series capacity and a parallel capacity, a coupling tube having input electrodes and output electrodes, means coupling said input electrodes to said intermediate frequency amplifier, means coupling the output electrodes of said coupling tube to the input electrodes of said pair of thermionic tubes, a plurality of transformers, one of said transformers having a single primary winding and the other of said transformers having a pair of primary windings, circuits connecting the output electrodes of said tubes in push-pull relation through the primary winding of said transformer having a single primary winding, circuits connecting the output electrodes of said tubes in parallel through the primary windings of said transformer having a pair of primary windings, and means for connecting means with the secondary windings of each of said transformers.

15. A device for converting signal modulated oscillations of an ultra high frequency into characteristic signal modulated oscillations of lesser frequency comprising, an electron discharge device having an anode, a cathode and a control electrode, a conductor connected to the control electrode of said tube, a conductor connected to the anode of said tube, a circuit for maintaining the control electrode of said tube at a high positive potential with respect to the anode and cathode of said tube whereby oscillations are produced in said tube, a condenser connected between said conductors to tune the circuit formed by said conductors and said condenser to a frequency equal to the frequency of the signal wave plus or minus the frequency to which it is desired to convert the signal carrying ultra high frequency oscillations, a circuit for impressing the ultra high frequency signal modulated wave on said conductors, and a second condenser connected across said conductors at points spaced from said first named condenser, said second named condenser serving to tune the circuit formed thereby and by the other condenser and conductors to the lower frequency desired, to by-pass the ultra high frequency oscillations and to couple said circuit to a load.

16. In combination in an ultra high frequency wave receiving system, a bipolar antenna tuned to the incoming signal wave, an ultra high frequency oscillating demodulator of the beat frequency type for producing an intermediate frequency, said oscillator comprising, an electron discharge device having an anode, a control electrode and a cathode, and having means for maintaining the control electrode at a high positive potential relative to the cathode and anode, a pair of Lecher wires connected to said anode and control electrode, a tuning condenser connected across said Lecher wires, said antenna being coupled to said Lecher wires through blocking condensers, an additional condenser connected across said Lecher wires, said additional condenser acting as a by-pass for the ultra high frequency oscillations and to tune said Lecher wires to the intermediate frequency and an output circuit coupled to said Lecher wires.

17. A circuit for demodulating ultra high frequency waves modulated in amplitude and in frequency including an oscillating detector comprising, radiant energy absorbing means, a thermionic tube having input and output electrodes, said input and output electrodes being coupled together by a frequency determining circuit and connected to said radiant energy absorbing means, an intermediate frequency amplifier, capacitive means coupling said intermediate frequency amplifier to said oscillating detector, a pair of thermionic detector tubes each having a controlling electrode and an anode, a phase shifting circuit coupled to said intermediate frequency amplifier on the one hand and to a controlling electrode in each of said thermionic detectors on the other hand, said phase shifting circuit including inductances in series and a parallel capacity, a coupling tube having input electrodes and output electrodes, means coupling said input electrodes to said intermediate frequency amplifier and said output electrodes to a controlling electrode in each tube of said pair of thermionic tubes, a plurality of transformers each having a primary winding and a secondary winding, a circuit connecting the anodes of said pair of tubes in push-pull relation through the primary of one of said transformers, circuits connecting the anodes of said pair of tubes in parallel through the primary winding of the other of said transformers, and means for connecting an indicator with the secondary winding of each of said transformers.

18. The method of demodulating ultra high frequency oscillatory energy which has been modulated in frequency in accordance with signals which includes the steps of reducing the frequency of said oscillatory energy without reducing the degree of modulation thereon, dividing said oscillatory energy into two portions, producing a phase shift in the energy of one of said portions such that there is a phase quadrature relation between the energies in said respective portions, and differentially combining the energies to render the signal.

19. In a signal demodulating system to be used with a source of signal modulated oscillations, a pair of thermionic detector tubes each having a control grid, a cathode and an anode, output circuits connected with the anodes of said tubes, a thermionic coupling tube having input and output electrodes, a circuit connecting the input electrodes of said coupling tubes to said source of signal modulated oscillations, a reactance connecting the control grids and cathodes of each of said detector tubes in parallel, a circuit coupling the output electrode of said coupling tube to said reactance, said last named circuit including phase shifting means, an additional coupling tube having input electrodes and output electrodes, a circuit connected with the input electrodes of said additional coupling tube, said circuit being coupled to said source of signal modulated oscillations, a phase shifting circuit comprising series inductances and parallel capacitances connected between the output electrodes of said additional coupling tube, a third coupling tube having input and output electrodes, a circuit connecting the input electrodes of said third coupling tube to said phase shifting circuit, and a transformer having a primary winding coupled to the output electrodes of said third coupling tube, and a secondary winding connected between the control electrodes of said pair of thermionic detectors.

20. In a system for demodulating wave energy the frequency of which has been modulated in accordance with signals, a circuit on which said wave energy the frequency of which has been modulated is impressed, a pair of electron discharge systems each having input and output electrodes, a utilization circuit coupled with said output electrodes, an input circuit tuned substantially to the mean frequency of said modulated wave energy connected to the input electrodes of said electron discharge systems, said input circuit including an inductance, a first frequency modulated wave energy path having an input coupled to said first circuit, said first path including an inductance inductively coupled to said first named inductance, said first path serving to transfer frequency modulated wave energy from said first circuit to said inductance in said tuned circuit, and a second frequency modulated wave energy path including a condenser having one terminal coupled to said first circuit and another terminal coupled to a point intermediate the terminals of said first inductance to also transfer frequency modulated wave energy from said first circuit to the input electrodes of said discharge systems.

21. A system as recited in claim 20 wherein said inductance in said input circuit is shunted by a resistance to broaden the response characteristic of said input circuit with respect to the frequency modulated wave energy.

22. In a system for demodulating frequency modulated wave energy, heterodyning means for reducing the frequency of said frequency modulated wave energy, means for amplifying the frequency modulated wave energy of reduced frequency, a circuit on which said amplifier frequency modulated wave energy of reduced frequency is impressed, a pair of rectifier systems each having input and output electrodes, an output circuit connecting said output electrodes in push-pull relation, a first path for transferring voltages characteristic of the frequency modulated wave energy from said first circuit in phase opposition to the input electrodes of said rectifier systems comprising a tuned reactance connecting the input electrodes of said rectifier systems in push-pull relation, a second tuned reactance coupled to said first named tuned reactance, and a coupling between said second tuned reactance and said first circuit, and a second path for transferring voltages characteristic of said frequency modulated wave energy from said first circuit to the input electrodes of said rectifier systems comprising a capacity having one terminal coupled to said first circuit and a second terminal coupled by similar conductors to said input electrodes.

23. A system as recited in claim 22 wherein one of said tuned reactances is shunted by a resistance to widen its response characteristics with respect to said frequency modulated wave energy.

24. In a system for demodulating frequency modulated wave energy, a source of frequency modulated wave energy, a pair of electron discharge tube systems each having input and output electrodes, an output circuit connected with said output electrodes, an inductance tuned to the mean frequency of said wave energy connecting the input electrodes of said discharge tube systems in push-pull relation whereby voltages induced in said inductance are impressed in phase opposition on said input electrodes, a second inductance coupled to said first inductance and means for impressing frequency modulated wave energy from said source on said second inductance, a condenser having two terminals, means coupling one terminal of said condenser to an input electrode in each of said systems and means connecting the other terminal of said condenser to said source of frequency modulated wave energy whereby voltages characteristic of said frequency modulated wave energy are transferred by said condenser from said source to said input electrodes in substantially like phase.

25. A system as recited in claim 24 wherein at least one of said inductances is shunted by a resistance to broaden the resonance characteristic of said tuned circuit.

26. In a system for demodulating frequency modulated wave energy, a circuit on which said frequency modulated wave energy is impressed, a pair of electron discharge devices each having a control grid, a cathode, and an anode, an output circuit connecting said anodes and cathodes in push-pull relation, a first path for transferring frequency modulated wave energy from said first circuit in phase opposition to the control grids and cathodes of said discharge devices, said first path comprising a tuned reactance connecting the control grids and cathodes of said devices in push-pull relation and a second tuned reactance coupled to said first named tuned reactance, and a connection between said second tuned reactance and said first circuit, and a second path for transferring frequency modulated wave energy in like phase to the input electrodes of said discharge devices comprising a capacity having a terminal coupled to said first circuit and having a second terminal coupled to said control grids by substantially equivalent conductors.

27. A system as recited in claim 26 wherein at least one of said tuned reactances is shunted by a resistance to broaden the resonance characteristic thereof.

28. In a system for demodulating frequency modulated wave energy, a circuit on which said frequency modulated wave energy is impressed, a pair of electron discharge tubes each having a plurality of control electrodes, an anode, and a cathode, an output circuit connected with said anodes and cathodes, a first path for transferring frequency modulated wave energy from said first circuit in phase opposition to the corresponding control electrodes in said tubes comprising a tuned reactance connecting a corresponding electrode in each of said tubes in a push-pull circuit, a second reactance coupled to said first named tuned reactance, and a connection between said second reactance and said first circuit, and a second path for transferring modulated wave energy in phase to other corresponding control electrodes in said tubes comprising a capacity having a terminal coupled to said first circuit and having a terminal connected by electrically equivalent conductors to said other corresponding control electrodes in said tubes.

29. A system as recited in claim 28 wherein at least one of said tuned reactances is shunted by a resistance to broaden the resonance characteristic thereof.

30. In a system for demodulating frequency modulated wave energy, an impedance on which the frequency modulated wave energy is impressed, a pair of detector tubes each having an anode, a cathode, and a control grid, an output circuit connected with said anodes and cathodes, an inductance tuned to the mean frequency of said wave energy connecting the control grids of said tubes in push-pull relation whereby voltages induced in said inductance are impressed in phase opposition on said control grids, a second inductance coupled to said first inductance and means for impressing frequency modulated wave energy from said source on said second inductance, a condenser having one terminal connected to the cathode of each of said tubes, and means connecting the other terminal of said condenser to said source of frequency modulated wave energy whereby voltages characteristic of said frequency modulated wave energy are transferred by said condenser substantially in phase on said cathodes.

31. In a system for demodulating wave energy the frequency of which has been modulated in accordance with signals, a circuit on which said wave energy the frequency of which has been modulated is impressed, a pair of electron discharge rectifier systems having input and output electrodes, a utilization circuit coupled with said output electrodes, a parallel circuit having inductance and capacity tuned to the mean frequency of said modulated wave energy connected between input electrodes of said electron discharge rectifier systems, a first path coupled to said first circuit, said first path including an inductance coupled to the inductance of said tuned circuit, said first path transferring modulated wave energy to said tuned circuit, and a second path including a condenser connected to said first mentioned circuit and to a point intermediate the terminals of said tuned circuit to transfer modulated wave energy from said first circuit to input electrodes of said rectifier systems.

32. In a system for demodulating frequency modulated wave energy, a pair of electron discharge rectifier systems having input and output electrodes, a demodulation output circuit connected with said output electrodes, a circuit on which said frequency modulated wave energy is impressed, a path for transferring frequency modulated wave energy from said circuit in push-pull relation to the input electrodes of said rectifier systems, said path including an inductance coupled between the input electrodes of said electron discharge rectifier systems and a second inductance connected to said circuit and coupled inductively to said first inductance, condensers connected in shunt to and tuning said inductances, and a second path for transferring frequency modulated wave energy from said circuit to said rectifier system input electrodes said second path comprising a condenser connected between said circuit and said input electrodes.

33. In a receiver for receiving and translating frequency modulated waves, a pair of rectifier systems each having input and output electrodes, a coil connected between and in phase opposition to like input electrodes of said rectifiers, a condenser in shunt to said coil for tuning said coil to the mean frequency of frequency modulated waves to be detected by said rectifiers, a primary coil, means for feeding frequency modulated waves into said primary coil, said primary coil being inductively coupled to the coil connected between like electrodes of said rectifier systems, a condenser connected to an intermediate point on the coil connected between input electrodes of said rectifier systems, means feeding frequency modulated waves through said condenser to said first mentioned coil, a demodulation frequency impedance connected between and in phase opposition to like output electrodes of said rectifier systems, and a signal translating system connected to said impedance.

34. A receiver for frequency modulated waves comprising means for heterodyning received frequency modulated waves to a convenient intermediate frequency, a transformer having a tuned secondary coil tuned to the mean frequency of the frequency modulated intermediate frequency waves, means for feeding the frequency modulated waves of intermediate frequency to the primary of said transformer and thereby transferring said waves to the tuned secondary by virtue of inductive coupling, a pair of rectifier systems each having input and output electrodes, means connecting said tuned secondary coil in phase opposition between and to a pair of like input electrodes of said rectifiers, a condenser connected cophasally or in push-push to like input electrodes of said rectifier systems, means for feeding the frequency modulated waves of intermediate frequency through said condenser in push-push to said like input electrodes, and a demodulation frequency circuit connected in phase opposition between and to like output electrodes of said rectifier systems.

35. A receiver for frequency modulated waves comprising means for heterodyning received frequency modulated waves to a convenient intermediate frequency, a transformer having a condenser tuned primary coil and a condenser tuned secondary coil tuned to the mean frequency of the frequency modulated intermediate frequency waves, means for feeding the frequency modulated waves of intermediate frequency to the condenser tuned primary of said transformer and thereby transferring said waves to the tuned secondary by virtue of inductive coupling, a pair of rectifier systems each having input and output electrodes, means connecting said tuned secondary coil in phase opposition between and to a pair of like input electrodes of said rectifiers, a condenser connected cophasally or in push-push to like input electrodes of said rectifier systems, means feedng frequency modulated waves thru said condenser in push-push to said input electrodes, and a demodulation frequency circuit connected in phase opposition between and to like output electrodes of said rectifier systems.

36. In a system for demodulating wave energy the frequency of which has been modulated in accordance with signals, a circuit on which said wave energy the frequency of which has been modulated is impressed, a pair of electron discharge rectifier systems having input and output electrodes, a utilization circuit coupled with said output electrodes, a circuit tuned to the mean frequency of said modulated wave energy connected between the input electrodes of said electron discharge systems, said tuned circuit including an inductance, a second inductance coupled to said first inductance, a first path coupled to said first circuit, said first path including said second inductance coupled to said first named inductance, said first path transferring modulated wave energy from said first circuit to said inductance and thence to the input electrodes of said rectifier systems in phase displaced relation, and a second path including a connection between said first circuit and a point on and intermediate the terminals of said first inductance to transfer modulated wave energy from said first circuit substantially in phase to the input elecrodes of said rectifier systems.

37. A system as recited in claim 36 wherein said inductances are shunted by resistances.

RALPH W. GEORGE.